(12) United States Patent
Kong et al.

(10) Patent No.: US 12,463,106 B2
(45) Date of Patent: Nov. 4, 2025

(54) ELECTRIC ASSEMBLY INCLUDING HEAT SPREADING LAYER

(71) Applicant: 3M INNOVATIVE PROPERTIES COMPANY, St. Paul, MN (US)

(72) Inventors: Jiwoong Kong, Hwaseong-si (KR); Jung Ju Suh, Seocho-gu (KR)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 452 days.

(21) Appl. No.: 17/917,070

(22) PCT Filed: Mar. 3, 2021

(86) PCT No.: PCT/IB2021/051761
§ 371 (c)(1),
(2) Date: Oct. 5, 2022

(87) PCT Pub. No.: WO2021/205247
PCT Pub. Date: Oct. 14, 2021

(65) Prior Publication Data
US 2023/0154817 A1    May 18, 2023

(30) Foreign Application Priority Data
Apr. 7, 2020 (KR) .................. 10-2020-0042400

(51) Int. Cl.
*H01L 23/367* (2006.01)
*H01L 23/00* (2006.01)
(Continued)

(52) U.S. Cl.
CPC ........ *H01L 23/367* (2013.01); *H01L 23/3121* (2013.01); *H01L 23/3135* (2013.01);
(Continued)

(58) Field of Classification Search
CPC ............... H01L 23/367; H01L 23/3121; H01L 23/3135; H01L 23/3736; H01L 24/29;
(Continued)

(56) References Cited

U.S. PATENT DOCUMENTS 9,559,036 B1   1/2017 Hsieh et al.
10,985,111 B2  4/2021 Kong et al.
(Continued)

FOREIGN PATENT DOCUMENTS

JP   2012028484 A   2/2012
WO   2021198856 A1  10/2021

OTHER PUBLICATIONS

International search Report for PCT Application No. PCT/IB2021/051761 mailed on Jun. 1, 2021, 3 pages.
(Continued)

*Primary Examiner* — Patricia D Valenzuela
(74) *Attorney, Agent, or Firm* — Jonathan L. Tolstedt

(57) ABSTRACT

According to an embodiment of the present invention, an electronic assembly comprises: a circuit board including a plurality of connection parts having electrical conductivity; a plurality of spaced apart semiconductor integrated circuits mounted on the circuit board and electrically connected to the plurality of connection parts; a protective layer disposed on the plurality of semiconductor integrated circuits, substantially surrounding the semiconductor integrated circuits, and having a flat upper surface; and a heat spreading copper layer disposed on the protective layer, having an average thickness greater than or equal to about 3 microns, and an average grain size greater than about 0.15 micron, wherein the heat spreading copper layer may occupy substantially the same space in a length and a width as the circuit board (coextensive), and the average thickness of the protective
(Continued)

layer may be equal to or greater than the height of the plurality of spaced apart semiconductor integrated circuits.

20 Claims, 8 Drawing Sheets

(51) Int. Cl.
    *H01L 23/31*     (2006.01)
    *H01L 23/373*     (2006.01)
    *H01L 25/065*     (2023.01)
    *H05K 7/20*     (2006.01)
    *H01L 23/29*     (2006.01)

(52) U.S. Cl.
    CPC .......... *H01L 23/3736* (2013.01); *H01L 24/29* (2013.01); *H01L 24/32* (2013.01); *H01L 25/0655* (2013.01); *H05K 7/20509* (2013.01); *H01L 23/293* (2013.01); *H01L 2224/2919* (2013.01); *H01L 2224/32245* (2013.01); *H01L 2924/0665* (2013.01)

(58) Field of Classification Search
    CPC ... H01L 24/32; H01L 25/0655; H01L 23/293; H01L 2224/2919; H01L 2224/32245; H01L 2924/0665; H01L 23/544; H01L 2223/54486; H01L 23/36; H01L 23/3735; H01L 23/29; H01L 23/31; H05K 7/20509
    See application file for complete search history.

(56) References Cited

U.S. PATENT DOCUMENTS

| | | |
|---|---|---|
| 2008/0118742 A1 | 5/2008 | Yokoyama et al. |
| 2011/0013349 A1 | 1/2011 | Morikita et al. |
| 2017/0115074 A1 | 4/2017 | Cheng |
| 2018/0190634 A1* | 7/2018 | Aoki ...................... H05K 3/341 |
| 2019/0206804 A1* | 7/2019 | Jung ..................... H05K 9/0075 |
| 2019/0318974 A1 | 10/2019 | Fujikawa |

OTHER PUBLICATIONS

Huang et al., Heat Transfer, Dongying: China Shiyou University Press, p. 24, Apr. 30, 2014.

* cited by examiner

ELECTRIC ASSEMBLY INCLUDING HEAT SPREADING LAYER

CROSS REFERENCE TO RELATED APPLICATIONS

This application is a national stage filing under 35 U.S.C. 371 of PCT/IB2021/051761, filed Mar. 3, 2021, which claims the benefit of Korean Application No. 10-2020-0042400, filed Apr. 7, 2020, the disclosure of which is incorporated by reference in their entireties herein.

BACKGROUND

The present invention relates to an electronic assembly including a heat spreading layer.

In a semiconductor device assembly, an integrated circuit die (alternatively, a semiconductor chip, a die) may be mounted on a packaging substrate. In the integrated circuit die, a heat managing device for protecting the semiconductor device assembly from heat flowing through the integrated circuit die may include heat spreading lids, heat sinks, and the like.

Meanwhile, as a large amount of heat is emitted in recent bitcoin mining systems, a method of depositing metal directly on a chip package has been emphasized in order to spread and dissipate the emitted heat.

However, in the related art, sputtering or plating technology has been used in a heat spreading layer for spreading and dissipating the emitted heat, and these technologies have problems in that delamination of a metal layer occurs due to a low contact force with an epoxy mold surface, process cost for producing the heat spreading layer with a large thickness (e.g., a thickness of 5 microns or more) is expensive, and the manufacturing time is long.

SUMMARY

Embodiments of the present invention are invented under the background as described above, and provide an electronic assembly including a heat spreading layer having excellent heat spreadability compared to the related art.

However, the objects to be achieved in the present invention are not limited to those described above, and other objects not described above will be apparently understood to those skilled in the art from the following description of the present invention.

According to an embodiment of the present invention, an electronic assembly comprises: a circuit board including a plurality of connection parts having electrical conductivity; a plurality of spaced apart semiconductor integrated circuits mounted on the circuit board and electrically connected to the plurality of connection parts; a protective layer disposed on the plurality of semiconductor integrated circuits, substantially surrounding the semiconductor integrated circuits, and having a flat upper surface; and a heat spreading copper layer disposed on the protective layer, having an average thickness greater than or equal to about 3 microns, and an average grain size greater than about 0.15 micron, wherein the heat spreading copper layer may occupy substantially the same space in a length and a width as the circuit board (coextensive), and the average thickness of the protective layer may be equal to or greater than the height of the plurality of spaced apart semiconductor integrated circuits.

According to another embodiment of the present invention, an electronic assembly comprises: a circuit board including a plurality of connection parts having electrical conductivity; a plurality of spaced apart semiconductor integrated circuits mounted on the circuit board and electrically connected to the plurality of connection parts; a protective layer disposed on the semiconductor integrated circuits, substantially surrounding the semiconductor integrated circuits, and having a flat upper surface; and a heat spreading copper layer disposed on the protective layer and having an average thickness equal to or greater than about 3 microns, wherein the average thickness of the protective layer may be equal to or greater than the height of the plurality of spaced apart semiconductor integrated circuits, the heat spreading copper layer may occupy substantially the same space in a length and a width as the circuit board, and the heat spreading copper layer may have a face-center-cubic structure having a lattice parameter of less than about 3.615 angstroms.

According to the embodiment of the present invention, it is possible to reduce the cost of producing an adhesive layer by adhering a heat spreading layer using an epoxy adhesive layer, and to increase heat spreadability by attaching a heat spreading layer having a larger thickness to an electronic assembly.

DETAILED DESCRIPTION

Advantages and features of the present invention, and methods for accomplishing the same will be more clearly understood from exemplary embodiments described in detail below with reference to the accompanying drawings. However, the present invention is not limited to the embodiments set forth below, and may be embodied in various different forms. The present embodiments are just for rendering the disclosure of the present invention complete and are set forth to provide a complete understanding of the scope of the invention to a person with ordinary skill in the technical field to which the present invention pertains, and the present invention will only be defined by the scope of the appended claims.

In describing the embodiment of the present invention, a detailed description of known functions or constitutions will be omitted when it is judged that the detailed description thereof may unnecessarily make the gist of the present invention unclear. In addition, terms to be described below as terms which are defined in consideration of functions in the embodiments of the present invention may vary depending on the intentions of a user or an operator or usual practices. Accordingly, the terms need to be defined based on contents throughout this specification.

Figure 1:
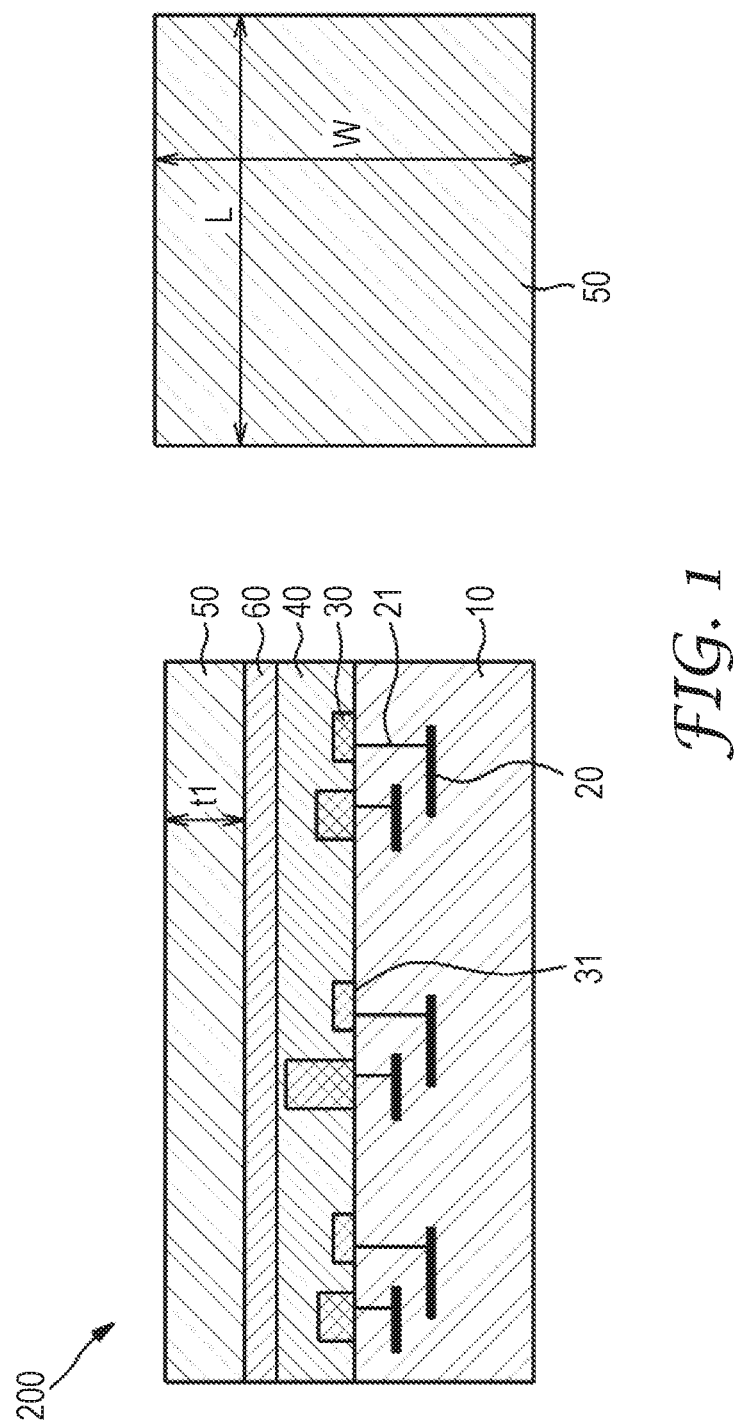
FIG. 1 illustrates a schematic cross-sectional view of an electronic assembly according to an embodiment of the present invention.

FIG. 1 illustrates a schematic cross-sectional view of an electronic assembly according to an embodiment of the present invention.

Referring to FIG. 1, an electronic assembly 200 may include a circuit board 10, a connection part 20, an electronic device 30, a protective layer 40, a heat spreading layer 50, and an adhesive layer 60. According to the embodiment, the electronic assembly 200 may include various components that are not selectively mentioned. That is, a cross-sectional view of the electronic assembly 200 illustrated in FIG. 1 is only illustrative.

The circuit board 10 is a component provided so that various types of components may be mounted, and may be referred to as the substrate 10 according to an embodiment. The circuit board 10 may include a printed circuit board (PCB) or the like.

The connection part 20 is a component having electrical conductivity. At least one connection part 20 may be included or disposed inside the circuit board 10 or on the surface of the circuit board 10. Components disposed (mounted) on the circuit board 10 may exchange signals with each other through the connection part 20 included or disposed in the circuit board 10.

When two or more connection parts 20 are included or disposed inside the circuit board 10 or on the surface of the circuit board 10, the connection parts 20 may be electrically isolated from or connected to each other.

The electronic device 30 is a component designed to perform various functions. The electronic device 30 may include a semiconductor integrated circuit (semiconductor IC) or a CMOS image sensor.

The electronic device 30 is electrically connected to the connection part 20 (21) and may be disposed (mounted) on the circuit board 10 (an upper surface of the circuit board 10). When a plurality of electronic devices 30 is disposed on the circuit board 10, each of the plurality of electronic devices 30 may be disposed to be spaced apart from each other on a space of the electronic device 30.

When the plurality of electronic devices 30 is disposed on the circuit board 10 and two or more connection parts 20 are included or disposed inside the circuit board 10 or on the surface of the circuit board 10, each of the plurality of electronic devices 30 may be electrically connected to different connection parts 20 from each other, and one or more of the plurality of electronic devices 30 may be electrically connected to two or more connection parts 20.

According to the embodiment, the plurality of electronic devices 30 disposed on the circuit board 10 may have different types, sizes, and/or functions from each other.

The protective layer 40 may be disposed on the electronic device 30 to substantially encapsulate (i.e., cover) the electronic device 30 in order to protect the electronic device 30 from the outside. Here, the fact that the protective layer 40 is 'disposed to encapsulate' the electronic device 30 may mean that the protective layer 40 is disposed to surround a part or all of the remaining surface except for a surface (e.g., a lower surface 31 of the electronic device 30) in contact with the circuit board 10 of the surfaces of the electronic device 30.

The upper surface of the protective layer 40 may be substantially flat. When the plurality of electronic devices 30 is disposed on the circuit board 10, the height of each of the electronic devices 30 may be different from each other according to a different type of electronic device 30. In this case, since the protective layer 40 is disposed to substantially encapsulate the plurality of electronic devices 30, the adhesive layer 60 has a flat surface (i.e., an upper surface of the flat protective layer 40) regardless of the height of the plurality of electronic devices 30.

The protective layer 40 may include an epoxy molding compound (EMC).

The adhesive layer 60 may be attached to the upper surface of the protective layer 40. The adhesive layers 60 may be attached on the upper surface of the protective layer 40 and the lower surface of the heat spreading layer 50 between the protective layer 40 and the heat spreading layer 50 to adhere the heat spreading layer 50 and the protective layer 40. In order to adhere the heat spreading layer 50 and the protective layer 40 using the adhesive layer 60, an operation of laminating and then curing the adhesive layer 60 may be performed.

The adhesive layer 60 may be an epoxy adhesive. An average thickness of the adhesive layer 60 may be about 15 microns. When the adhesive layer 60 includes an epoxy adhesive, the metal layer may be fixed harder than that of direct sputtering, and the heat spreading layer 50 having a larger average thickness may be adhered on the adhesive layer 60.

The heat spreading layer 50 may be attached to the upper surface of the adhesive layer 60. The heat spreading layer 50 may include a copper foil.

According to an embodiment, an average thickness t1 of the heat spreading layer 50 may be about 3 microns or more. More specifically, the average thickness t1 of the heat spreading layer 50 may be about 6 microns or more and about 18 microns or less. More specifically, according to an embodiment, the average thickness t1 of the heat spreading layer 50 may be 3 microns, 6 microns, 12 microns, or 18 microns, and according to another embodiment, the average thickness t1 of the heat spreading layer 50 may be 25 microns or 35 microns.

The heat spreading layer 50 may have a face-center-cubic structure having a lattice parameter of less than about 3.615 angstroms or less than about 3.614 angstroms.

The average grain size of the heat spreading layer 50 may be greater than about 0.1 micron. More specifically, the average grain size of the heat spreading layer 50 may be greater than about 0.5 micron, or may be greater than about 1 micron. Alternatively, the average grain size of the heat spreading layer 50 may be between about 0.1 micron and about 10 microns, between about 0.25 micron and about 10 microns, between about 1 micron and about 10 microns, or between about 0.15 micron and about 0.5 micron.

The heat spreading layer 50 may occupy the same space as the circuit board 10 in a length L and a width W when viewed from the upper surface of the heat spreading layer 50 (coextensive).

According to an embodiment, a black epoxy layer (not illustrated) may be additionally disposed on the heat spreading layer 50. Since the black epoxy layer 70 is disposed on the heat spreading layer 50, laser marking of the electronic assembly 200 may be facilitated.

Figure 2:
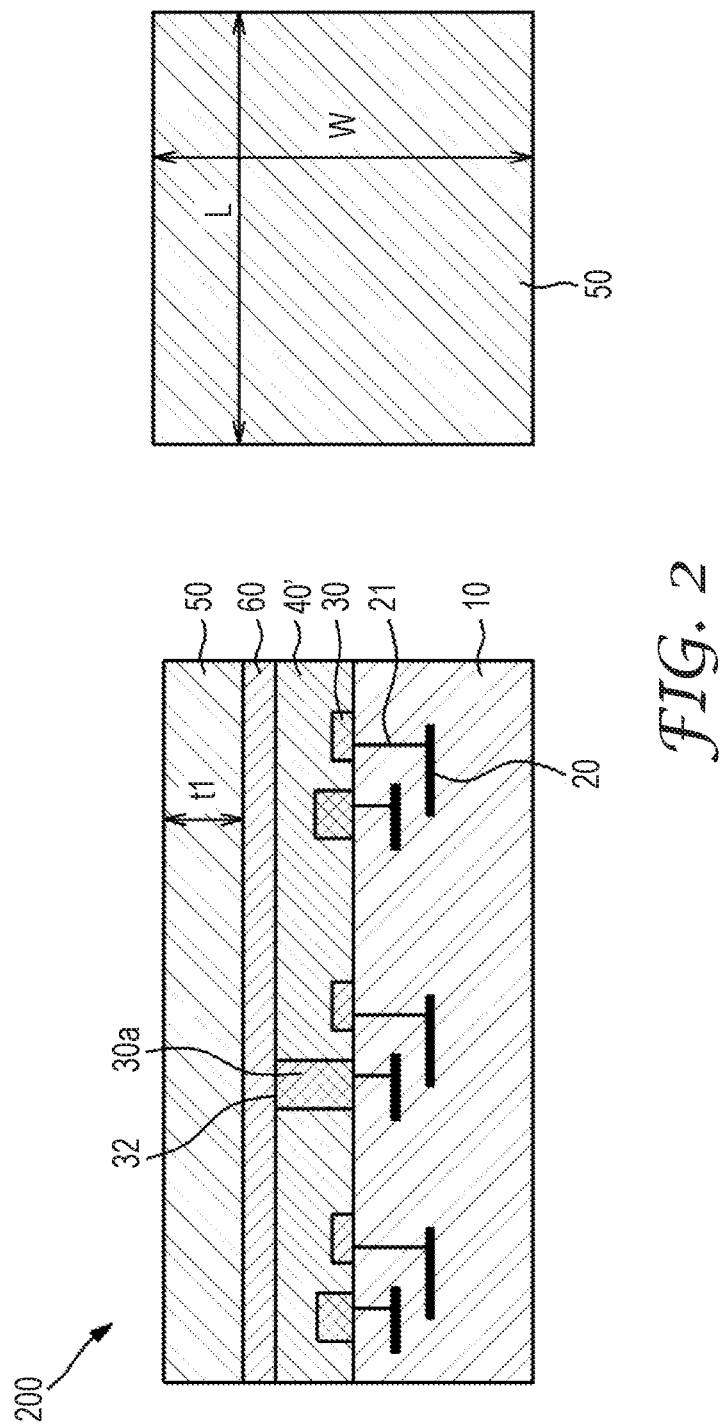
FIG. 2 is a schematic cross-sectional view of an electronic assembly according to another embodiment of the present invention.

FIG. 2 is a schematic cross-sectional view of an electronic assembly according to another embodiment of the present invention.

Referring to FIG. 2, an electronic assembly 200 includes a circuit board 10, a connection part 20, an electronic device 30, a protective layer 40', a heat spreading layer 50, and an adhesive layer 60.

The circuit board 10, the connection part 20, and the heat spreading layer 50 illustrated in FIG. 2 may perform substantially the same functions as the circuit board 10, the connection part 20, and the heat spreading layer 50 illustrated in FIG. 1. Accordingly, the description of the circuit board 10, the connection part 20, and the heat spreading layer 50 illustrated in FIG. 2 will apply correspondingly to the description of the circuit board 10, the connection part 20, and the heat spreading layer 50 illustrated in FIG. 1.

In addition, in the description of the electronic device 30, the protective layer 40, and the adhesive layer 60 illustrated in FIG. 1, the contents which are not contrary to the contents described with reference to FIG. 2 will apply correspondingly to the description of an electronic device 30, a protective layer 40', and an adhesive layer 60 illustrated in FIG. 3.

The protective layer 40' may be disposed on the electronic device 30 to encapsulate (i.e., cover) at least some of the plurality of electronic devices 30. That is, the protective layer 40' may be disposed on the electronic device 30 to encapsulate the electronic devices 30 except for some of the plurality of electronic devices 30.

Here, the fact that the protective layer 40' is 'disposed to encapsulate at least some of the electronic devices' may mean that the protective layer 40' is a disposed so as not to surround at least a part 32 of the remaining surface except for a surface in contact with the circuit board 10 among the surfaces of one or more electronic devices 30a among the plurality of electronic devices 30. As can be seen from FIG. 2, as the average thickness of the protective layer 40' and the height of an electronic device 30a having the highest height among the plurality of electronic devices 30 are substantially the same as each other, the protective layer 40' may not be disposed to surround the upper surface 32 of the electronic device 30a. However, even in this case, the height of the electronic device 30a having the highest height among the plurality of electronic devices 30 may not be greater than the average thickness of the protective layer 40'.

The adhesive layer 60 may be attached to the upper surface of the protective layer 40'. However, since the average thickness of the protective layer 40' and the height of the electronic device 30a having the highest height among the plurality of electronic devices 30 are substantially the same as each other, when the protective layer 40' is not disposed to surround the upper surface 32 of the electronic device 30a, the adhesive layer 60 may be attached to the upper surface of the protective layer 40' and the upper surface 32 of the electronic device 30a.

According to an embodiment, a black epoxy layer (not illustrated) may be additionally disposed on the heat spreading layer 50. Since the black epoxy layer 70 is disposed on the heat spreading layer 50, laser marking of the electronic assembly 200 may be facilitated.

Figure 3:
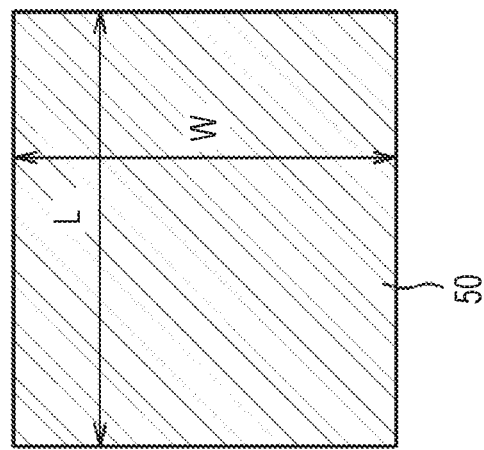
FIG. 3 is a schematic cross-sectional view of an electronic assembly according to yet another embodiment of the present invention.
Figure 3:
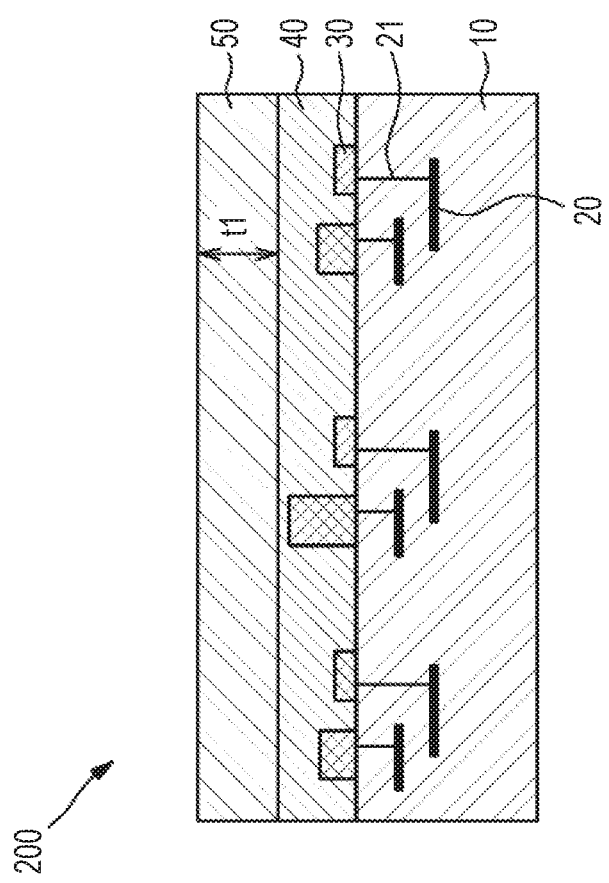

FIG. 3 is a schematic cross-sectional view of an electronic assembly according to yet another embodiment of the present invention.

Referring to FIG. 3, an electronic assembly 200 may include a circuit board 10, a connection part 20, an electronic device 30, a protective layer 40, and a heat spreading layer 50'.

The circuit board 10, the connection part 20, and the electronic device 30 illustrated in FIG. 3 may perform substantially the same functions as the circuit board 10, the connection part 20, and the electronic device 30 illustrated in FIG. 1. Accordingly, the description of the circuit board 10, the connection part 20, and the electronic device 30 illustrated in FIG. 3 will apply correspondingly to the description of the circuit board 10, the connection part 20, and the electronic device 30 illustrated in FIG. 1.

In addition, in the description of the protective layer 40 and the heat spreading layer 50 illustrated in FIG. 1, the contents which are not contrary to the contents described with reference to FIG. 3 will apply correspondingly to the description of the protective layer 40 and the heat spreading layer 50' illustrated in FIG. 3.

The electronic assembly 200 of FIG. 3 may not include the adhesive layer 60. Accordingly, the heat spreading layer 50' may be disposed directly on the protective layer 40.

According to an embodiment, as illustrated in FIG. 2, since the average thickness of the protective layer 40' and the height of the electronic device 30a having the highest height among the plurality of electronic devices 30 are substantially the same as each other, when the protective layer 40' is not disposed to surround the upper surface 32 of the electronic device 30a, the heat spreading layer 50' may be disposed directly on the upper surface of the protective layer 40' and the upper surface 32 of the electronic device 30a.

Figure 4:
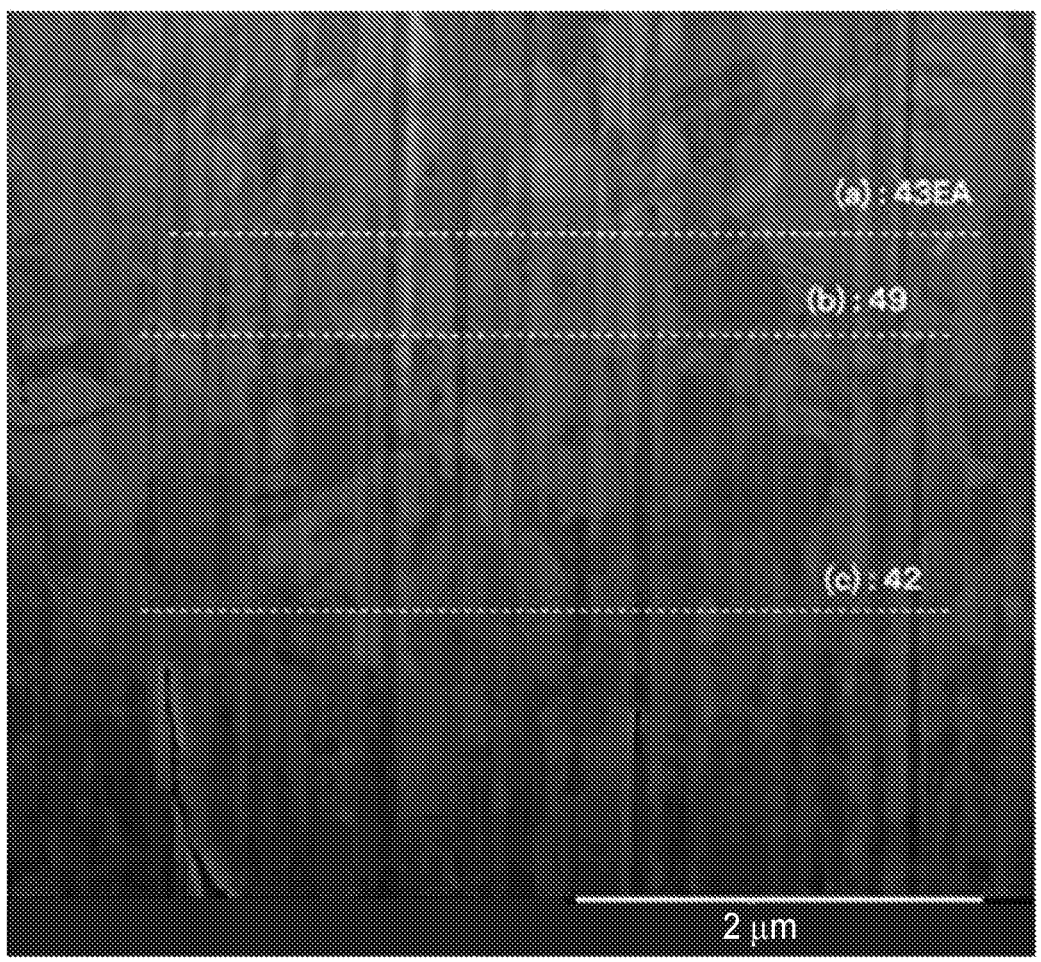
FIG. 4 illustrates an average grain size of a heat spreading layer in the related art.
Figure 5:
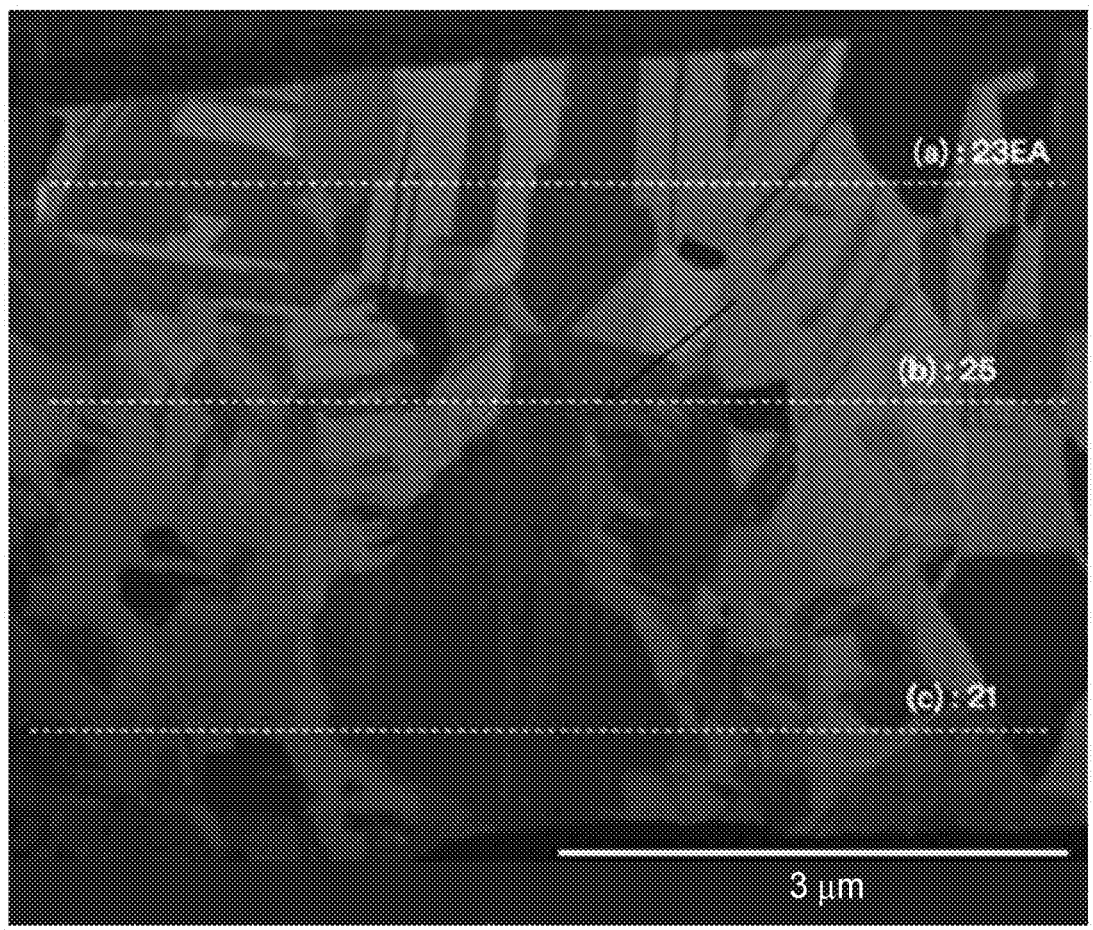
FIG. 5 illustrates an average grain size of a heat spreading layer using an electro deposition (ED) method according to an embodiment of the present invention.
Figure 6:
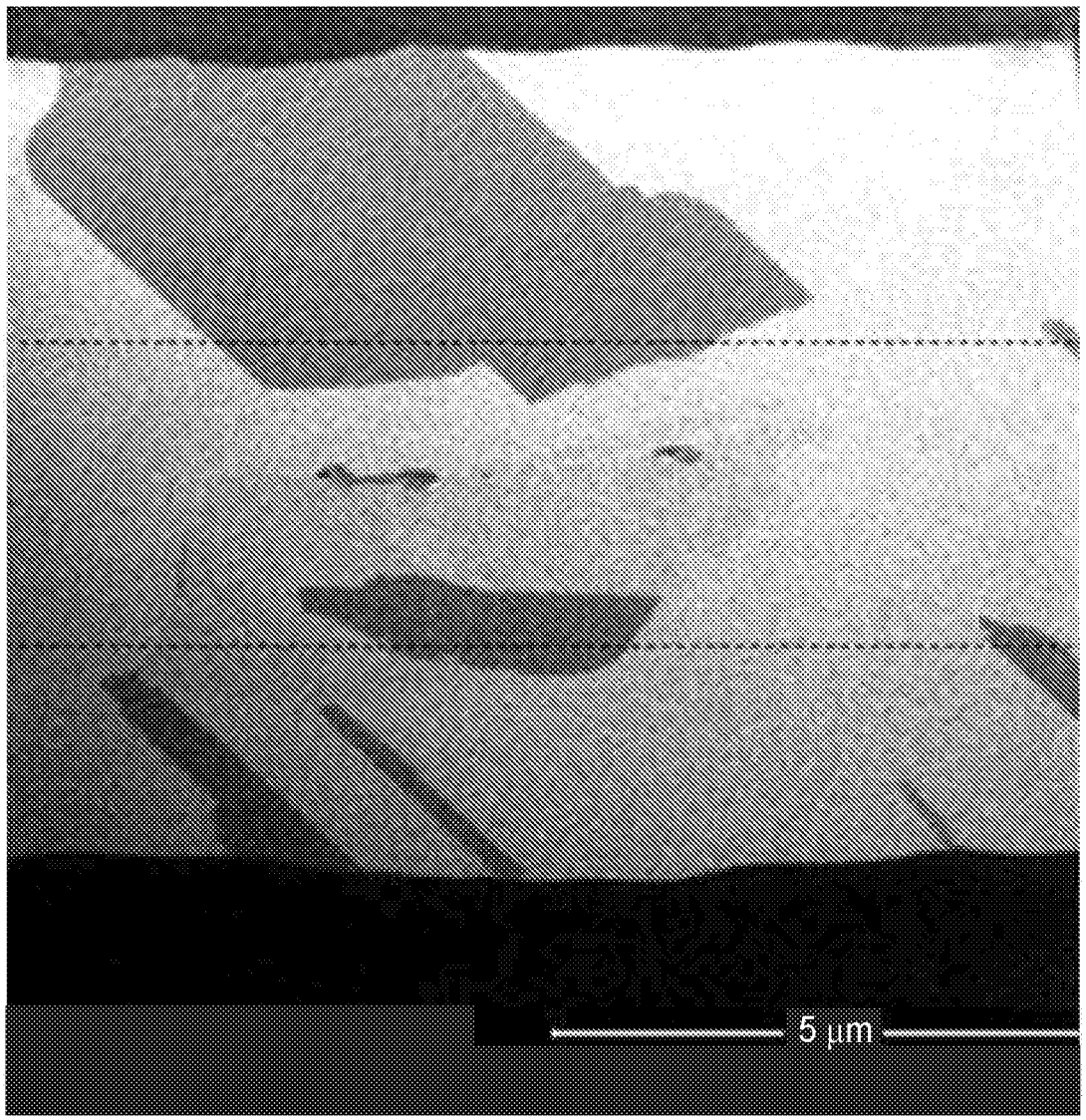
FIG. 6 illustrates an average grain size of a heat spreading layer using a rolled annealed (RA) method according to another embodiment of the present invention.

FIG. 4 illustrates an average grain size of a heat spreading layer in the related art, FIG. 5 illustrates an average grain size of a heat spreading layer using an electro deposition (ED) method according to an embodiment of the present invention, and FIG. 6 illustrates an average grain size of a heat spreading layer using a rolled annealed (RA) method according to another embodiment of the present invention.

Referring to FIGS. 4 and 5, the average grain size of the heat spreading layer may correspond to a value obtained by dividing the length of a dotted line by the number of grains included on the dotted line. That is, the average grain size may be calculated by indicating a dotted line on at least one portion of a cross section of the heat spreading layer and calculating how many grains are included on the indicated dotted line.

Referring to FIG. 4, in order to calculate the average grain size of the heat spreading layer using the sputtering method in the related art, three dotted lines having lengths of 4 microns may be indicated in a cross section of the heat spreading layer using the sputtering method in the related art.

Since the number of grains included in the three dotted lines indicated in the cross section of the heat spreading layer using the sputtering method in the related art are 43, 49, and 42, respectively, the average grain size of the heat spreading layer using the sputtering method in the related art may be calculated to be about 0.09 micron (=4 microns/about 44.67 grains).

On the other hand, referring to FIG. 5, in order to calculate the average grain size of a heat spreading layer (50 and 50', representatively 50) using an ED method according to an embodiment of the present invention, three dotted lines having lengths of 6 microns may be indicated in a cross section of the heat spreading layer 50 using the ED method.

Since the number of grains included in the three dotted lines indicated in the cross section of the heat spreading layer 50 using the ED method are 23, 25, and 21, respectively, the average grain size of the heat spreading layer 50 using the ED method according to an embodiment of the present invention may be calculated to be about 0.26 micron (=6 microns/about 23 grains).

Further, referring to FIG. 6, in order to calculate the average grain size of a heat spreading layer (50 and 50', representatively 50) using a RA method according to another embodiment of the present invention, two dotted lines having lengths of 10 microns may be indicated in a cross section of the heat spreading layer 50 using the RA method.

However, as illustrated in FIG. 6, since the grain size of the heat spreading layer 50 using the RA method is much larger than the grain size of the heat spreading layer using the sputtering method and the grain size of the heat spreading layer using the ED method, it can be seen that it is difficult to accurately calculate the average grain size of the heat spreading layer 50 using the RA method. However, in the case of FIG. 6, the average grain size of the heat spreading layer 50 using the RA method may be calculated as approximately 2 microns to 5 microns (=10 microns/2 to 5 grains).

That is, referring to FIGS. 4 to 6, it can be seen that the average grain sizes of the heat spreading layer using the ED method and the heat spreading layer using the RA method according to an embodiment of the present invention are much larger than the average grain size of the heat spreading layer using the sputtering method in the related art. Accordingly, the heat spreading layer according to an embodiment of the present invention and the heat spreading layer according to the related art may be distinguished by comparing the average grain sizes of the heat spreading layers.

FIG. 7 illustrates a difference between a growth direction of a heat spreading layer using a sputtering method in the related art and a growth direction of a heat spreading layer according to an embodiment of the present invention.

Figure 7A:
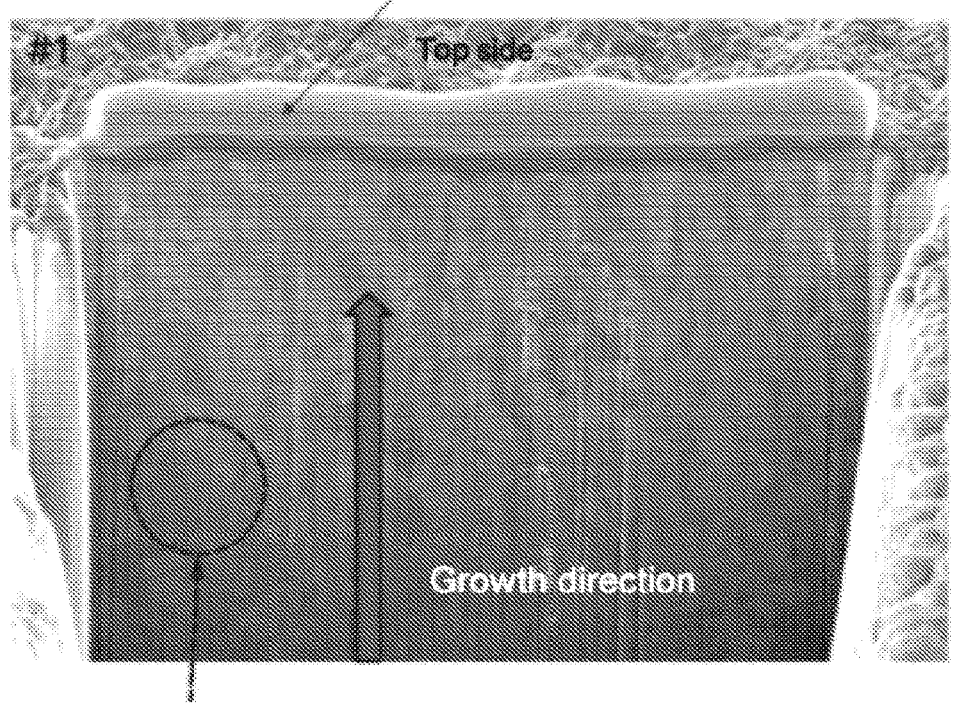
FIG. 7 illustrates a difference between a growth direction of a heat spreading layer using a sputtering method in the related art and a growth direction of a heat spreading layer according to an embodiment of the present invention.
Figure 7B:
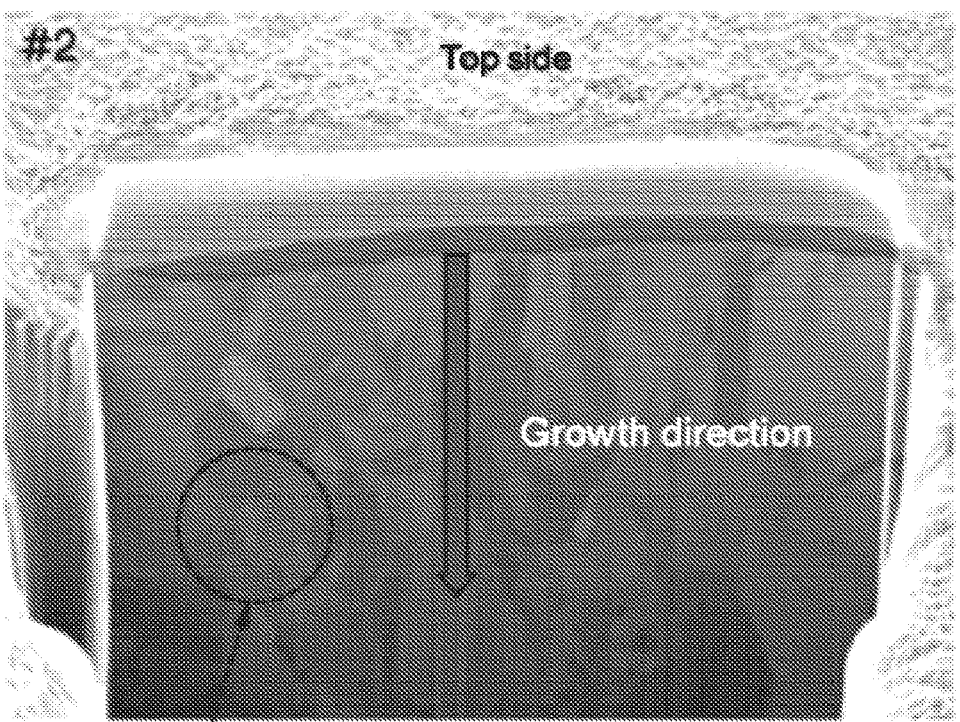

Referring to FIG. 7, FIG. 7A illustrates a cross section of a heat spreading layer using a sputtering method in the related art, and FIG. 7B illustrates a cross section of a heat spreading layer using an electro deposition method according to an embodiment of the present invention.

Referring to FIG. 7, it can be seen that the heat spreading layer using the sputtering method in the related art is formed from a bottom side to a top side, and the heat spreading layer using the ED method according to an embodiment of the present invention is formed from the top side to the bottom side.

Here, the 'bottom side' and the 'top side' may be illustrated based on a direction in which the heat spreading layer 50 is attached to the protective layer 40 or the adhesive layer 60. That is, the 'bottom side' of the heat spreading layer refers to a lower surface of the heat spreading layer 50, that is, a surface on which the heat spreading layer 50 is attached to the protective layer 40 or the adhesive layer 60. The 'top side' of the heat spreading layer refers to an upper surface of the heat spreading layer 50, that is, a surface on which a top surface of the electronic assembly 200 or the heat spreading layer 50 is attached to the black epoxy layer (not illustrated).

As illustrated in FIG. 7, a growth direction of the heat spreading layer using the sputtering method in the related art and a growth direction of the heat spreading layer using the ED method according to an embodiment of the present invention are different from each other. Accordingly, the heat spreading layer according to an embodiment of the present invention and the heat spreading layer according to the related art may be distinguished by comparing the growth directions of the heat spreading layers.

Figure 8:
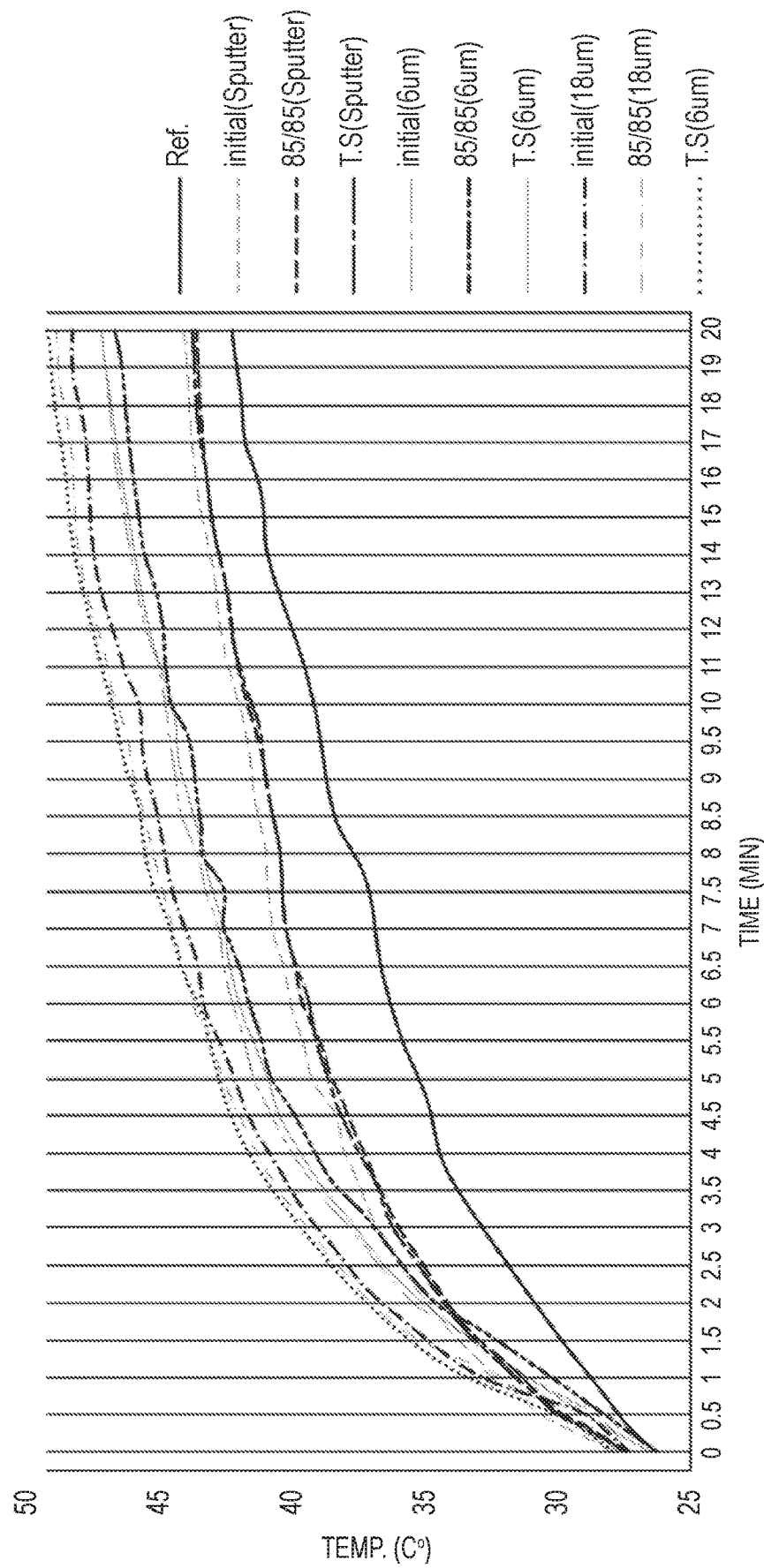
FIG. 8 illustrates a temperature according to heat spread through a heat spreading layer using a sputtering method in the related art and a temperature according to heat spread through a heat spreading layer according to an embodiment of the present invention.

FIG. 8 illustrates a temperature according to heat spread through a heat spreading layer using a sputtering method in the related art and a temperature according to heat spread through a heat spreading layer according to an embodiment of the present invention.

Referring to FIG. 8, a graph of FIG. 8 shows a graph of temperature per hour measured at a distance of 3 cm from a heat source (heat spreading layer).

In FIG. 8, Ref may represent a heat source without including a heat spreading layer, Sputter may represent a heat spreading layer using a sputtering method in the related art, 6 μm may represent a heat spreading layer including a copper foil having an average thickness of 6 μm according to an embodiment of the present invention, and 18 μm may represent a heat spreading layer including a copper foil having an average thickness of 18 μm according to another embodiment of the present invention.

In addition, in FIG. 8, initial may represent an initial state in which peripheral factors are not fixed, 85/85 may represent a state in which the temperature is fixed to 85° and the humidity is fixed to 85%, and T.S may represent a state after a thermal shock test at −40° to 85°.

Referring to FIG. 8, it can be seen that the heat spreading layer including the copper foil having the average thickness of 6 μm has an overall high level of heat spreadability as compared to the heat spreading layer using the sputtering method in the related art, and the heat spreading layer including the copper foil having the average thickness of 18 μm has an overall high level of heat spreadability as compared to the heat spreading layer including the copper foil having the average thickness of 6 μm.

Accordingly, it can be confirmed that the heat spreading layer according to an embodiment of the present invention is excellent in heat spreading performance as compared to the heat spreading layer using the sputtering method in the related art, and the heat spreading layer according to an embodiment of the present invention is excellent in heat spreading performance as the average thickness of the copper foil is increased.

The following embodiments of the present invention are listed.

Item 1 is the electronic assembly, wherein at least some of the plurality of connection parts are electrically isolated from each other.

Item 2 is the electronic assembly, wherein each of the semiconductor integrated circuits is electrically connected to a different connection part from each other.

Item 3 is the electronic assembly, wherein at least two or more of the plurality of connection parts are electrically connected to the same semiconductor integrated circuit.

Item 4 is the electronic assembly, wherein the protective layer includes an epoxy molding compound (EMC).

Item 5 is the electronic assembly, wherein the protective layer substantially surrounds each semiconductor integrated circuit in the plurality of spaced apart semiconductor integrated circuits.

Item 6 is the electronic assembly, wherein the protective layer substantially encapsulates each semiconductor integrated circuit.

Item 7 is the electronic assembly, wherein the protective layer substantially encapsulates each semiconductor integrated circuit except for a lower surface of at least one semiconductor integrated circuit facing the circuit board.

Item 8 is the electronic assembly, wherein the upper surface of the protective layer is flat with the upper surface of at least one of the plurality of semiconductor integrated circuits, and the protective layer encapsulates the remaining semiconductor integrated circuits other than the at least one of the plurality of semiconductor integrated circuits.

Item 9 is the electronic assembly, wherein the average thickness of the heat spreading copper layer is greater than about 10 microns.

Item 10 is the electronic assembly, wherein the heat spreading copper layer is disposed directly on the protective layer and attached to the protective layer.

Item 11 is the electronic assembly, further including an adhesive layer disposed between the heat spreading copper layer and the protective layer.

Item 12 is the electronic assembly, wherein the heat spreading copper layer has a face-center-cubic structure having a lattice parameter of less than about 3.615 angstroms or less than about 3.614 angstroms.

Item 13 is the electronic assembly, wherein the average grain size of the heat spreading copper layer is greater than about 0.5 micron.

Item 14 is the electronic assembly, wherein the average grain size of the heat spreading copper layer is greater than about 1 micron.

Item 15 is the electronic assembly, wherein the average grain size of the heat spreading copper layer is between about 0.25 micron and about 10 microns.

Item 16 is the electronic assembly, wherein the average grain size of the heat spreading copper layer is between about 1 micron and about 10 microns.

Item 17 is the electronic assembly, wherein the average grain size of the heat spreading copper layer is between about 0.15 micron and about 0.5 micron.

Combinations of each block of the block diagram accompanied to the present invention and each step of the flowchart may also be performed by computer program instructions. Since these computer program instructions may be mounted on encoding processors of a general-purpose computer, a special-purpose computer or other programmable data processing devices, the instructions executed by the encoding processors of the computer or other programmable data processing devices generate means of performing functions described in each block of the block diagram or each step of the flowchart. Since these computer program instructions may also be stored in a computer-usable or computer-readable memory capable of orientating a computer or other programmable data processing devices to implement functions by a specific method, the instructions stored in the computer-usable or computer-readable memory may produce a manufacturing item containing instruction means for performing the functions described in each block of the block diagram or each step of the flowchart. Since the computer program instructions may also be mounted on the computer or other programmable data processing devices, a series of operational steps are performed on the computer or other programmable data processing devices to generate a process executed by the computer, so that the instructions performing the computer or other programmable data processing devices can provide steps for executing the functions descried in each block of the block diagram and each step of the flowchart.

In addition, each block or each step may represent a part of a module, a segment, or a code that includes one or more executable instructions for executing a specified logical function(s). Alternatively, it should also be noted that in some alternative embodiments, the functions mentioned in the blocks or steps may be generated out of order. For example, two blocks or steps illustrated in succession may in fact be performed substantially simultaneously or the blocks or steps may be sometimes performed in reverse order according to the corresponding function.

The above description just illustrates the technical spirit of the present invention, and various changes and modifications can be made by those skilled in the art to which the present invention pertains without departing from the intrinsic quality of the present invention. Therefore, the embodiments disclosed in the present invention are intended not to limit the technical spirit of the present invention but to describe the present invention and the scope of the technical spirit of the present invention is not limited by these embodiments. The protective scope of the present invention should be construed based on the appended claims, and all the technical spirits in the equivalent range thereof should be construed as falling within the scope of the present invention.

DESCRIPTION OF REFERENCE NUMERALS

200: Electronic assembly
10: Circuit board
20: Connection part
30: Electronic device
40: Protective layer
50: Heat spreading layer
60: Adhesive layer

What is claimed is:

1. An electronic assembly comprising:
a circuit board including a plurality of connection parts having electrical conductivity;
a plurality of spaced apart semiconductor integrated circuits mounted on the circuit board and electrically connected to the plurality of connection parts;
a protective layer disposed on the plurality of semiconductor integrated circuits, substantially surrounding the semiconductor integrated circuits, and having a flat upper surface; and
a heat spreading copper layer disposed on the protective layer, having an average thickness greater than or equal to about 3 microns, and an average grain size greater than about 0.15 micron,
wherein the heat spreading copper layer occupies substantially the same space in a length and a width as the circuit board (coextensive), and
the average thickness of the protective layer is equal to or greater than the height of the plurality of spaced apart semiconductor integrated circuits.

2. The electronic assembly of claim 1, wherein at least some of the plurality of connection parts are electrically isolated from each other.

3. The electronic assembly of claim 1, wherein the protective layer substantially surrounds each semiconductor integrated circuit in the plurality of spaced apart semiconductor integrated circuits.

4. The electronic assembly of claim 1, wherein the protective layer substantially encapsulates each semiconductor integrated circuit except for a lower surface of at least one semiconductor integrated circuit facing the circuit board.

5. The electronic assembly of claim 1, wherein the upper surface of the protective layer is flat with the upper surface of at least one of the plurality of semiconductor integrated circuits, and
the protective layer encapsulates the remaining semiconductor integrated circuits other than the at least one of the plurality of semiconductor integrated circuits.

6. The electronic assembly of claim 1, wherein the average thickness of the heat spreading copper layer is greater than about 10 microns.

7. The electronic assembly of claim 1, wherein the heat spreading copper layer has a face-center-cubic structure having a lattice parameter of less than about 3.615 angstroms or less than about 3.614 angstroms.

8. The electronic assembly of claim 1, wherein the average grain size of the heat spreading copper layer is between about 0.15 micron and about 0.5 micron.

9. The electronic assembly of claim 1, wherein each of the semiconductor integrated circuits is electrically connected to a different connection part from each other.

10. The electronic assembly of claim 1, wherein at least two or more of the plurality of connection parts are electrically connected to the same semiconductor integrated circuit.

11. The electronic assembly of claim 1, wherein the protective layer includes an epoxy molding compound (EMC).

12. The electronic assembly of claim 1, wherein the protective layer substantially encapsulates each semiconductor integrated circuit.

13. The electronic assembly of claim 1, wherein the heat spreading copper layer is disposed directly on the protective layer and attached to the protective layer.

14. The electronic assembly of claim 1, further comprising an adhesive layer disposed between the heat spreading copper layer and the protective layer.

15. The electronic assembly of claim 1, wherein the average grain size of the heat spreading copper layer is greater than about 0.5 micron.

16. The electronic assembly of claim 1, wherein the average grain size of the heat spreading copper layer is greater than about 1 micron.

17. The electronic assembly of claim 1, wherein the average grain size of the heat spreading copper layer is between about 0.25 micron and about 10 microns.

18. The electronic assembly of claim 1, wherein the average grain size of the heat spreading copper layer is between about 1 micron and about 10 microns.

19. An electronic assembly comprising:
   a circuit board including a plurality of connection parts having electrical conductivity;
   a plurality of spaced apart semiconductor integrated circuits mounted on the circuit board and electrically connected to the plurality of connection parts;
   a protective layer disposed on the semiconductor integrated circuits, substantially surrounding the semiconductor integrated circuits, and having a flat upper surface; and
   a heat spreading copper layer disposed on the protective layer and having an average thickness equal to or greater than about 3 microns,
   wherein the average thickness of the protective layer is equal to or greater than the height of the plurality of spaced apart semiconductor integrated circuits,
   the heat spreading copper layer occupies substantially the same space in a length and a width as the circuit board, and
   the heat spreading copper layer has a face-center-cubic structure having a lattice parameter of less than about 3.615 angstroms.

20. The electronic assembly of claim 19, wherein the lattice parameter of the heat spreading copper layer is less than about 3.614 angstroms, and wherein the average grain size of the heat spreading copper layer is greater than about 0.15 micron.

* * * * *